United States Patent [19]

Bergemont

[11] Patent Number: 5,436,478
[45] Date of Patent: Jul. 25, 1995

[54] FAST ACCESS AMG EPROM WITH SEGMENT SELECT TRANSISTORS WHICH HAVE AN INCREASED WIDTH

[75] Inventor: Albert M. Bergemont, Santa Clara, Calif.

[73] Assignee: National Semiconductor Corporation, Santa Clara, Calif.

[21] Appl. No.: 214,818

[22] Filed: Mar. 16, 1994

[51] Int. Cl.$^6$ ............................................. H01L 29/78
[52] U.S. Cl. ................................... 257/316; 365/185; 365/230.06
[58] Field of Search ...................... 365/185, 230.06, 63; 257/316

[56] References Cited

U.S. PATENT DOCUMENTS

5,246,874  9/1993  Bergemont ........................... 437/52
5,315,541  5/1994  Harari et al. ........................ 365/63

Primary Examiner—Robert P. Limanek
Attorney, Agent, or Firm—Limbach & Limbach

[57] ABSTRACT

The current driven by the segment select transistors of an alternate-metal, virtual-ground (AMG) electrically programmable read-only-memory (EPROM), is increased by eliminating the even numbered segment select transistors in every other row of segment select transistors, and the odd numbered segment select transistors in the remaining rows, and by changing the current path through the segment so that the current flows from a segment select transistor in one row of segment select transistors to a segment select transistor in an adjacent row of transistors. By eliminating every other segment select transistor in each row of transistors, the maximum pitch of the segment select transistors can be substantially increased, thereby providing the required programming current, while at the same time maintaining the required isolation between adjacent segment select transistors.

4 Claims, 13 Drawing Sheets

001
FAST ACCESS AMG EPROM WITH SEGMENT SELECT TRANSISTORS WHICH HAVE AN INCREASED WIDTH

BACKGROUND OF THE INVENTION

1. Field of the Invention

The present invention relates to a "fast access", alternate-metal, virtual-ground (AMG) electrically-programmable read-only-memory (EPROM) and, in particular, to a fast access AMG EPROM with segment select transistors which have an increased width.

2. Discussion of the Related Art

A "fast access", alternate-metal, virtual-ground (AMG) electrically-programmable read-only-memory (EPROM) is a non-volatile memory that, like conventional EPROMs and electrically-erasable programmable read-only-memories (EEPROMs), retains data which has been stored in the memory when power is removed and which, unlike conventional EPROMs and EEPROMs, uses a series of access transistors to contact the source bit lines of the array, and a series of segment select transistors to segment the array.

Figure 1:
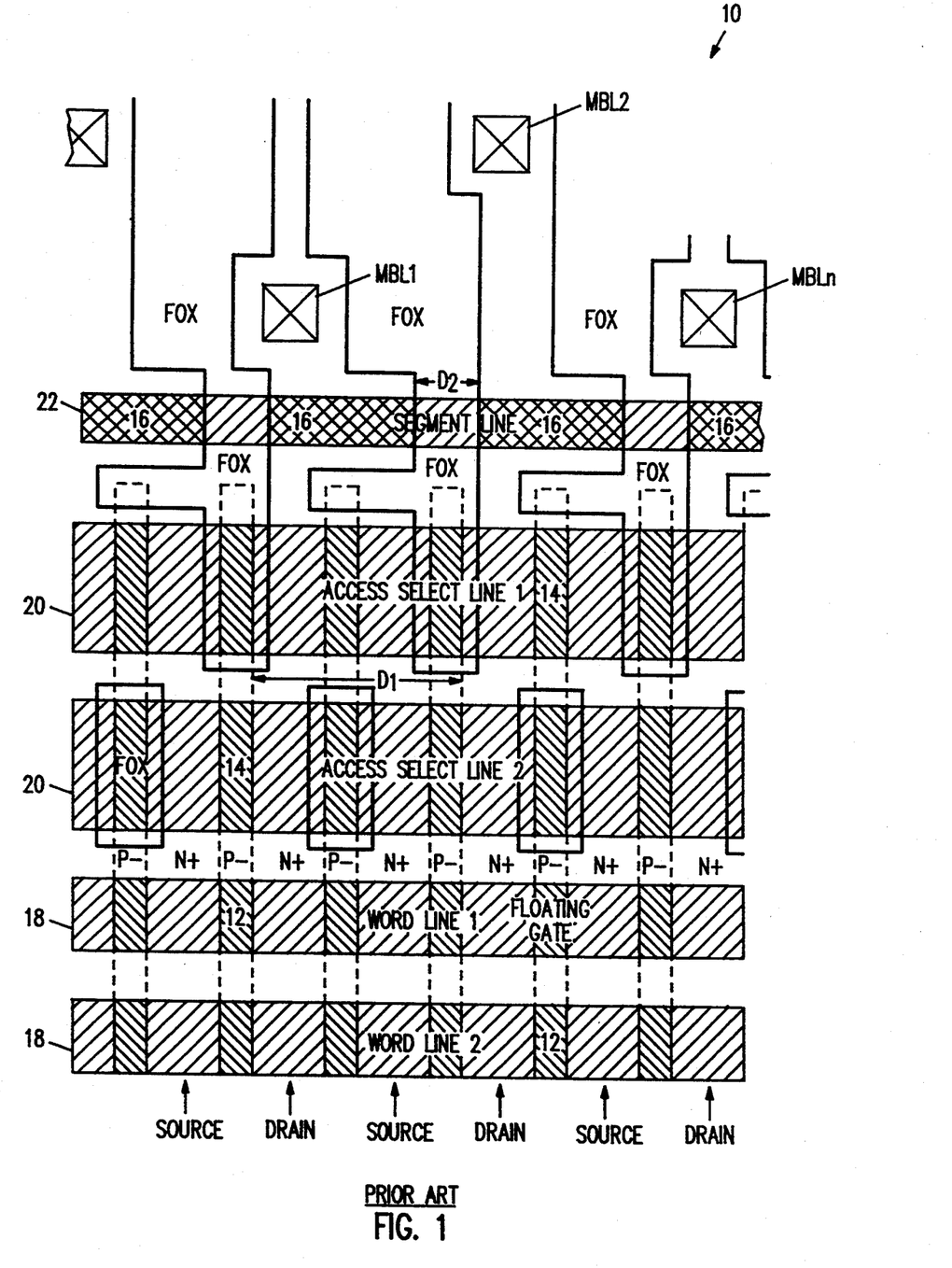
FIG. 1 is a plan view illustrating a portion of a conventional fast-access AMG EPROM array 10.

FIG. 1 shows a plan view that illustrates a portion of a conventional fast-access AMG EPROM array 10. As shown in FIG. 1, array 10 includes a series of memory cells 12, a series of access transistors 14, a series of segment select transistors 16, a series of metal bit line contacts MBL1-MBLn, and a series of field oxide regions FOX which isolate the access transistors 14, the segment select transistors 16, and the metal bit line contacts MBL1-MBLn.

In addition, the memory cells 12 in a row of memory cells share a common word line 18. As is well known, the portion of the word line 18 which is formed over each memory cell 12 in a row of memory cells functions as the control gate of the memory cells in that row. Similarly, the access transistors 14 in a row of access transistors and the segment select transistors 16 in a row of segment select transistors 16 share a common access select line 20 and a common segment line 22, respectively.

As also shown in FIG. 1, each memory cell 12 and each access transistor 14 in a column of memory cells and access transistors share a source bit line SOURCE and a drain bit line DRAIN with the remaining memory cells and access transistors in the column, and with the memory cells 12 and access transistors 14 in the horizontally-adjacent columns. In a conventional fast-access AMG EPROM, the metal bit lines typically contact the drain bit lines DRAIN via a segment select transistor 16 while, on the other hand, the source bit lines SOURCE are not contacted by a metal bit line.

Thus, as further shown in FIG. 1, in each row of segment select transistors 16, every second bit line is contacted by one segment select transistor 16. As a result, the maximum width of a segment select transistor, which has been fabricated with a 0.8 micron process, is defined by the distance $D_1$, which represents the 3.4 micron pitch of two bit lines, less the distance $D_2$, which represents the 1.7 micron isolation width that is required between adjacent segment select transistors 16. Therefore, since every other bit line is contacted by a segment select transistor 16, the maximum width of a segment select transistor 16 is limited by the isolation requirements of the adjacent cells.

One problem with utilizing segment select transistors 16, however, is that, due to the limited width of the transistors 16, the maximum current that can be driven by a segment select transistor 16 is typically less than the current which is required by the cells during programming. When less than the required programming current is provided, poor programming characteristics can result which, in turn, can lead to an erroneous value being read from the cell. Thus, there is a need for a fast-access AMG EPROM that incorporates segment select transistors which can drive the current required during programming and, at the same time, maintain the required isolation.

SUMMARY OF THE INVENTION

The fast-access alternate-metal, virtual-ground (AMG) electrically programmable read-only-memory (EPROM) of the present invention incorporates segment select transistors which can drive the required programming current by eliminating the even numbered segment select transistors in every other row of segment select transistors, and the odd numbered segment select transistors in the remaining rows of segment select transistors, and by changing the current path through the segment so that the current flows from a segment select transistor in one row of segment select transistors to a segment select transistor in an adjacent row of transistors.

By eliminating every other segment select transistor in each row of transistors, the maximum width of the segment select transistors can be substantially increased while at the same time maintaining the required isolation between adjacent segment select transistors.

In accordance with the present invention, the fast-access AMG EPROM includes a semiconductor substrate and a plurality of spaced-apart, parallel, bit lines which are formed in the semiconductor substrate. In addition, a plurality of spaced-apart memory cells are formed in a plurality of rows so that one memory cell in each row of memory cells is formed on the substrate between each pair of adjacent bit lines. Further, a plurality of word lines are formed so that each word line contacts each memory cell in a row of memory cells. The EPROM also includes a plurality of spaced-apart access select transistors which are formed in a plurality of pairs of rows so that, in each row of access select transistors, one access select transistor is formed on the substrate between every other pair of bit lines, and so that, in each pair of rows of access select transistors, one access select transistor is formed between each pair of bit lines. In addition, a plurality of access select lines are formed so that each access select line contacts each of the access select transistors in a row of access select transistors. The EPROM further includes a plurality of segment select transistors which are formed in a plurality of rows of segment select transistors so that one segment select transistor in each row of segment select transistors contacts every fourth bit line. In accordance with the present invention, the segment select transistors in each row of segment select transistors are staggered with respect to the segment select transistors in each adjacent row of segment select transistors so that every other bit line is contacted by one segment select transistor. In addition, a plurality of segment lines are formed so that each segment line contacts each of the segment select transistors in a row of segment select transistors.

A better understanding of the features and advantages of the present invention will be obtained by refer-

DETAILED DESCRIPTION

Figure 2:
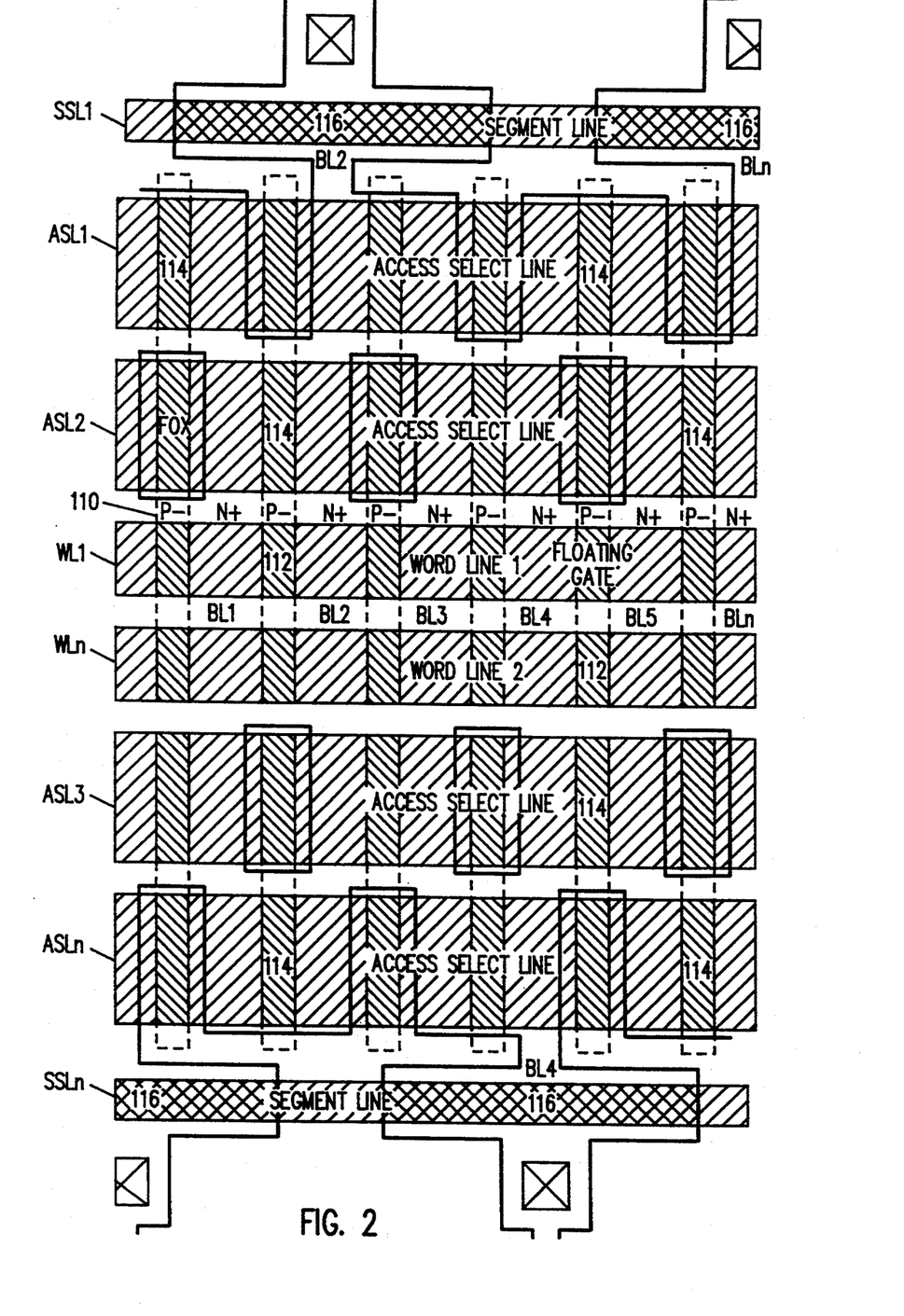
FIG. 2 is a plan view illustrating a "fast-access", alternate-metal, virtual-ground (AMG) electrically programmable read-only-memory (EPROM) 100 in accordance with the present invention.

FIG. 2 shows a plan view that illustrates a "fast-access", alternate-metal, virtual-ground (AMG) electrically programmable read-only-memory (EPROM) 100 in accordance with the present invention. As described above, the isolation requirements between adjacent segment select transistors in a conventional fastaccess AMG EPROM limit the maximum width of the segment select transistors. As a result, the maximum current that can be driven by the segment select transistors is less than the current which is required by the memory cells during programming.

As described in greater detail below, the present invention increases the maximum current that can be driven by the segment select transistors by eliminating the even numbered segment select transistors in every other row of segment select transistors, and the odd numbered segment select transistors in the remaining rows, and by changing the current path through the segment so that the current flows from a segment select transistor in one row of segment select transistors to a segment select transistor in an adjacent row of transistors.

By eliminating every other segment select transistor in each row of transistors, the maximum width of the segment select transistors can be substantially increased, thereby providing the required programming current, while at the same time maintaining the required isolation between adjacent segment select transistors.

As shown in FIG. 2, EPROM 100 includes a semiconductor substrate 110 of P-type conductivity and a series of spaced-apart, parallel, bit lines BL1-BLn which are formed in substrate 100. In addition, a plurality of spaced-apart memory cells 112 are formed in a plurality of rows so that, in each row of memory cells 112, one memory cell 112 is formed between each pair of bit lines BL.

Similarly, a plurality of spaced-apart access select transistors 114 are formed in a plurality of pairs of rows so that, in each row of access select transistors 114, one access select transistor 114 is formed between every other pair of bit lines BL, and so that, in each pair of rows, one access select transistor 114 is formed between each pair of bit lines BL.

EPROM 100 additionally includes a series of word lines WL1-WLn, which are formed so that each word line WL contacts each memory cell 112 in a row of memory cells 112, and a series of access select lines ASL1-ASLn, which are formed so that each access select line ASL contacts each of the access select transistors 114 in a row of access select transistors 114.

As further shown in FIG. 2, in accordance with the present invention, EPROM 100 also includes a plurality of segment select transistors 116 which are formed in a plurality of rows so that, in each row of segment select transistors 116, one segment select transistor 116 contacts every fourth bit line BL. In addition, the segment select transistors 116 in a row of segment select transistors 116 are staggered with respect to the segment select transistors 116 in each adjoining row so that every other bit line BL is contacted by one segment select transistor 116. Further, a series of segment lines SSL1-SSLn are formed so that each segment line SSL contacts each of the segment select transistors 116 in a row of segment select transistors 116.

Figure 3:
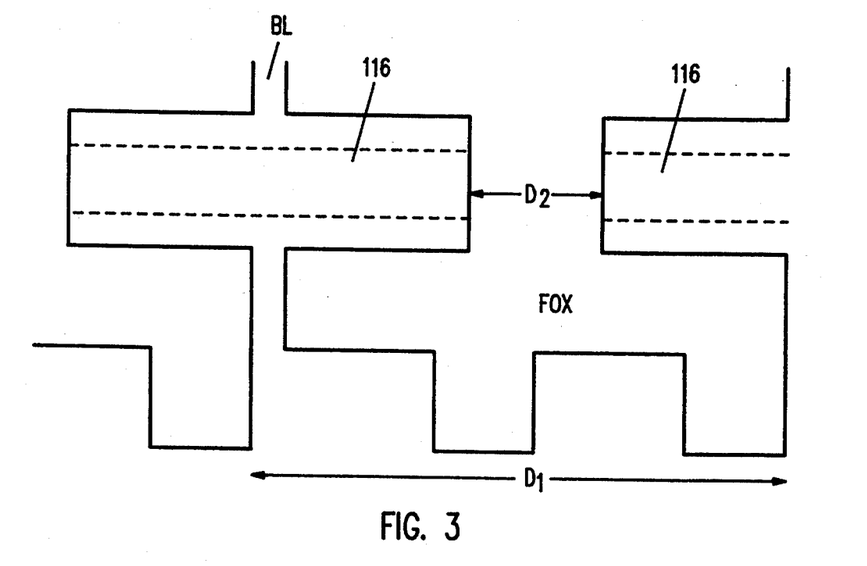
FIG. 3 is a plan view illustrating the increased width of the segment select transistors 116 in accordance with the present invention.

FIG. 3 shows a plan view that illustrates the increased width of the segment select transistors 116 in accordance with the present invention. As stated above, the maximum width of a segment select transistor in a conventional fast-access AMG EPROM which has been fabricated with a 0.8 micron process is limited to approximately 1.7 microns. This limitation results from the 3.4 micron pitch of two bit lines (every second bit line is contacted by one segment select transistor in each row of segment select transistors), less the 1.7 micron isolation width that is required between adjacent segment select transistors.

In the present invention, however, since only every fourth bit line BL is contacted by one segment select transistor 116 in each row of segment select transistors 116, the maximum width of a segment select transistor 116 is defined by the distance $D_1$, which represents the 6.8 micron pitch of four bit lines, less the distance $D_2$, which represents the 1.7 micron isolation width that is required between adjacent segment select transistors 116.

As a result, the present invention substantially increases the maximum width of the segment select transistors 116 from approximately 1.7 microns (the 3.4 micron two bit line pitch less the 1.7 micron isolation width) to approximately 5.1 microns (the 6.8 micron four bit line pitch less the 1.7 micron isolation width). Accordingly, the present invention provides a delta increase of approximately 3.4 microns.

Thus, each segment select transistor 116 can be formed so that the maximum current that can be driven by the segment select transistors 116 is equal to the current which is required by the memory cells during programming to insure that the memory cells of the array are properly programed.

The process of the present invention, which will be described with respect to a 0.8 micron photolithographic process, will now be described. FIGS. 4-14 show plan and cross-sectional views that illustrate the steps for forming a "fast-access", AMG EPROM in accordance with the present invention.

The process of the present invention begins with the provision of a semiconductor substrate of P-type conductivity. As is well known, substrate 100 includes a plurality of access select regions, where the to-be-formed access select transistors will be formed, a plurality of segment select regions where the segment select transistors and the metal bit line contacts will be formed, and a plurality of array regions, where the to-be-formed memory cells will be formed.

Figure 4:
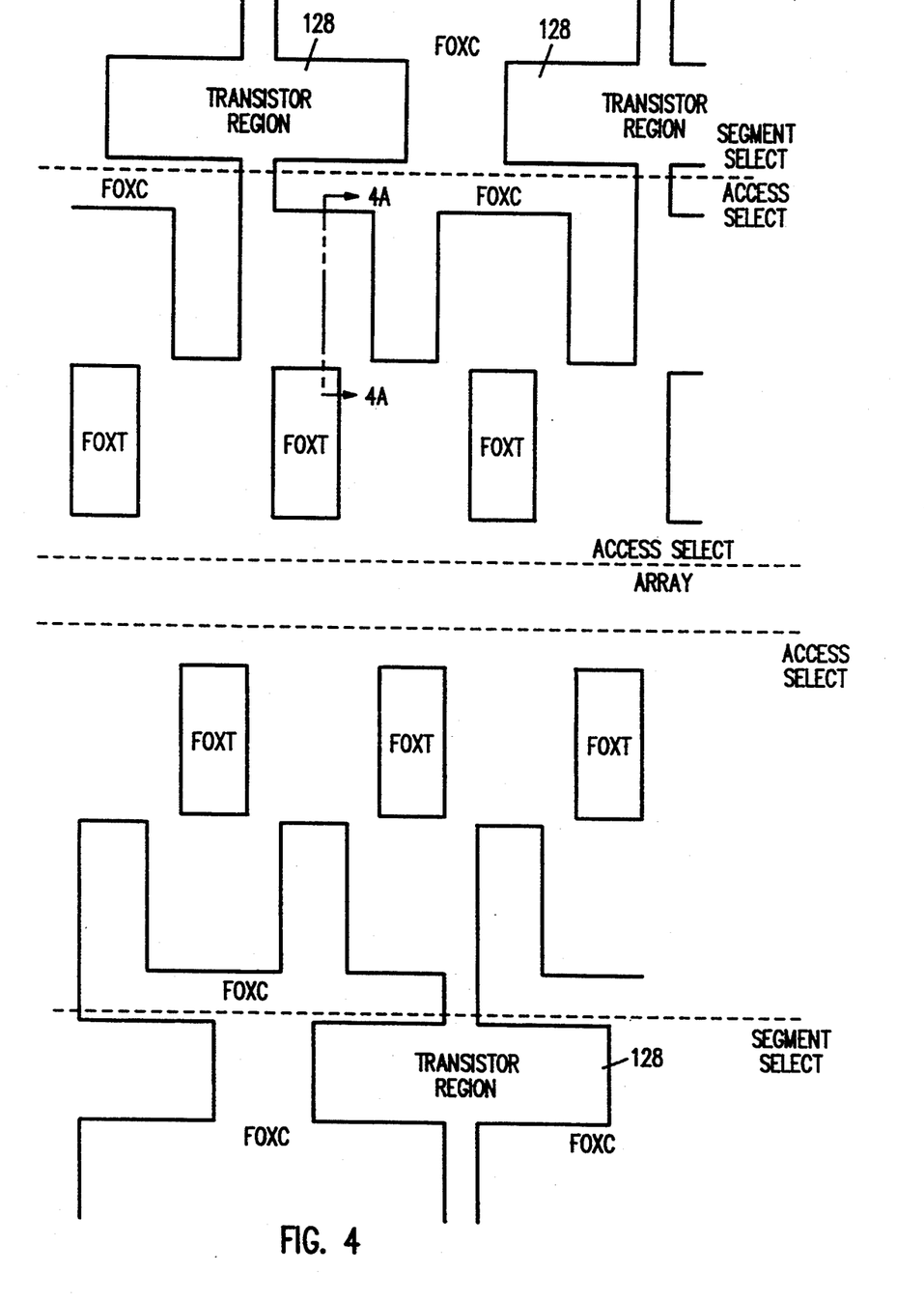
FIG. 4 is a plan view, illustrating the formation of the field oxide regions in a P-type semiconductor substrate 100.
Figure 5:
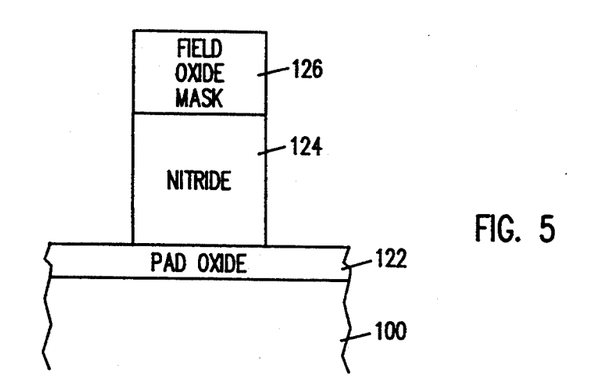
FIGS. 5 and 6 are cross-sectional diagrams taken along lines 4A—4A.
Figure 6:
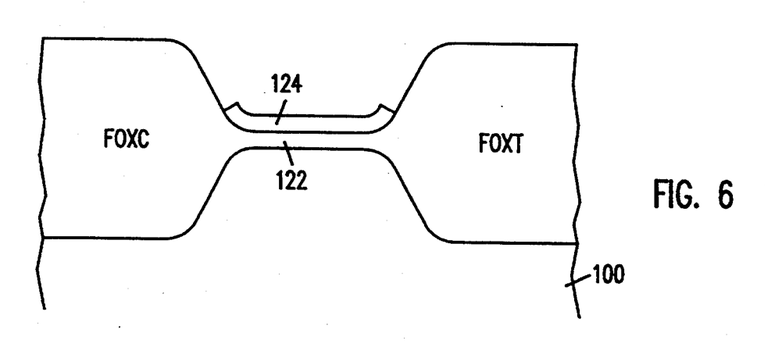

Following this, the next step is the formation of a plurality of field oxide regions in the access select regions and the segment select regions of substrate 100. FIG. 4 shows a plan view that illustrates the formation of the field oxide regions in a P-type semiconductor substrate 100. FIGS. 5 and 6 show crosssectional diagrams taken along lines 4A—4A.

As shown in FIG. 5, the field oxide regions are first formed by growing a layer of pad oxide 122 approximately 200 Å thick over substrate 100. This is followed by the deposition of an overlying layer of nitride 124 approximately 2,000 Å thick. Next, a field oxide mask 126 is formed over the nitride/pad oxide composite and patterned to define a plurality of rows of spaced-apart, contact-isolation field oxide regions FOXC, and a plurality of rows of spaced-apart transistor-isolation field oxide regions FOXT.

Following this, the unmasked areas are etched until the underlying layer of nitride 124 is removed. As a result of this etching step, a plurality of pad oxide regions are exposed. After the unmasked layer of nitride 124 has been removed, the field oxide mask is stripped. Following this, a P-field implant mask is formed and patterned to protect portions of the periphery. The unmasked regions of pad oxide regions are then implanted with $BF_2$ at 50 KeV to form implant regions which have an implant concentration of approximately $4 \times 10^{13}/cm^2$.

Referring to FIG. 6, after the pad oxide regions have been implanted, the resulting device is oxidized to form the contact-isolation field oxide regions FOXC and the transistor-isolation field oxide regions FOXT. As shown in FIG. 4, in accordance with the present invention, a transistor region 128 is formed between each adjacent pair of field oxide regions FOXC. In addition, the transistor regions 128 in one row of field oxide regions FOXC are staggered with respect to the transistor regions 128 in an adjacent row of field oxide regions FOXC.

The contact-isolation field oxide regions FOXC are utilized to isolate the to-be-formed metal bit line contacts, the segment select transistors, and the access transistors in the first row of access transistors, while the transistor-isolation field oxide regions FOXT are utilized to isolate the to-be-formed access transistors in the second row of access transistors. The fabrication steps utilized to form the field oxide regions FOXC and FOXT are conventional and well known in the art.

Once the field oxide regions FOXC and FOXT have been formed, the next step is to set the channel threshold voltages for the to-be-formed memory cells. The threshold voltages are set by first removing the nitride/pad oxide composite layer. Next, a layer of sacrificial oxide (not shown) is grown on the exposed substrate 100. Following this, a threshold voltage mask is formed over the layer of sacrificial oxide and patterned to protect the periphery.

After the threshold voltage mask has been formed and patterned, the semiconductor substrate 100 underlying the unmasked areas of sacrificial oxide is implanted with $B_{11}$ at 40 KeV to form an implant concentration of approximately $5 \times 10^{12}/cm^2$. Following this, the threshold voltage mask is stripped and the layer of sacrificial oxide is removed. The fabrication steps utilized to set the channel threshold voltages are also conventional and well known in the art.

Figure 7:
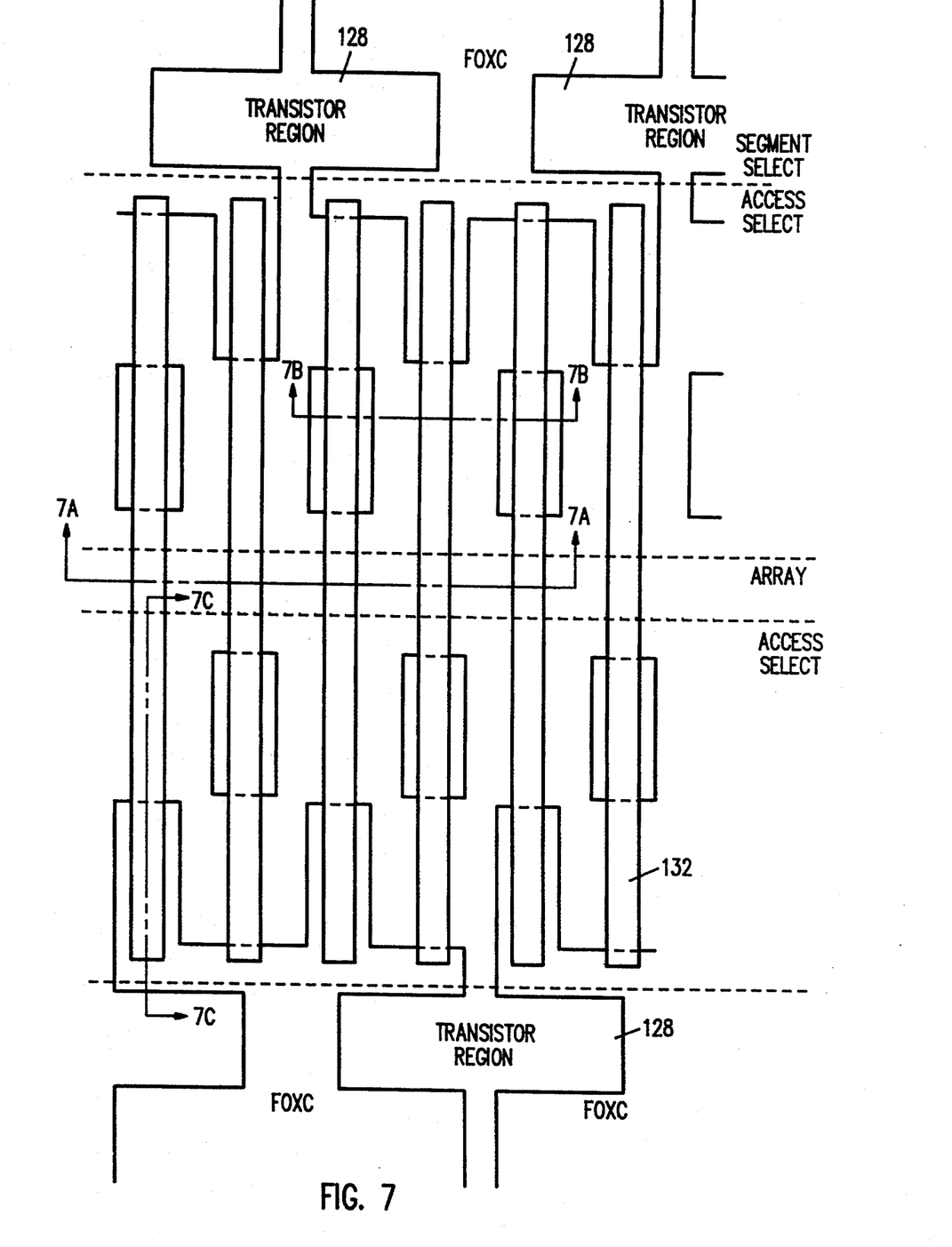
FIG. 7 is a plan view illustrating the initial formation of the floating gates.
Figure 8A:
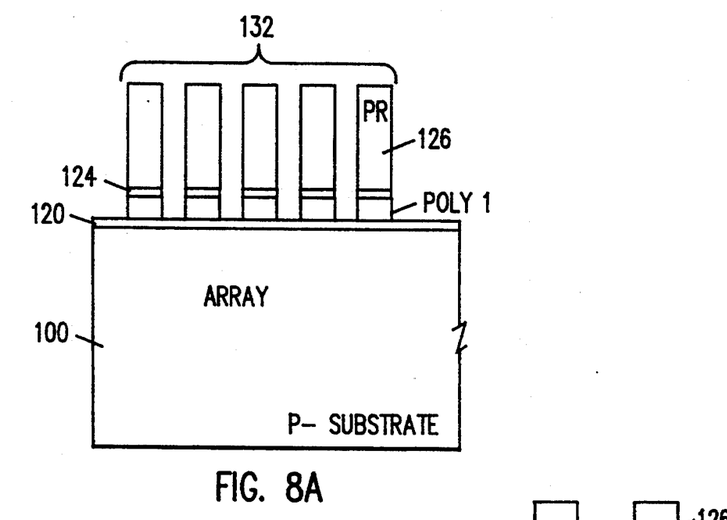
FIGS. 8A-8C are cross-sectional diagrams taken along lines 7A—7A, 7B—7B, and 7C—7C, respectively.
Figure 8B:
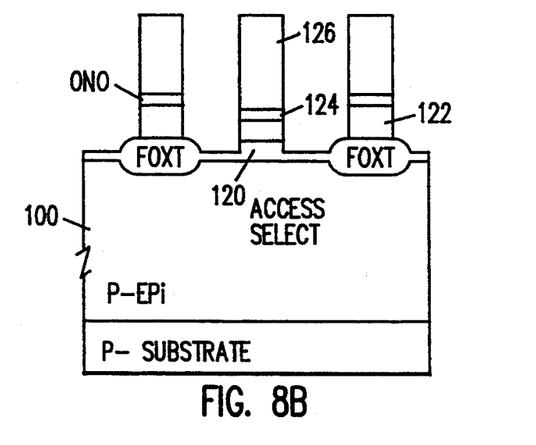
Figure 8C:
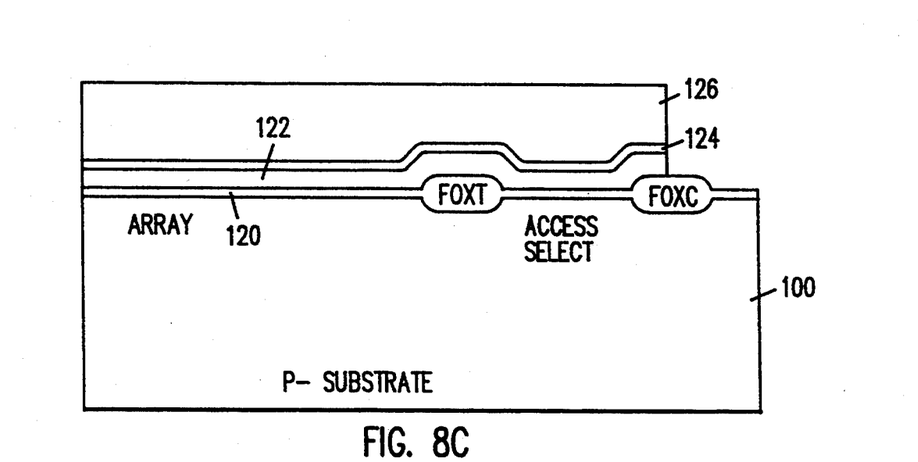

After the layer of sacrificial oxide has been removed, the next step is the initial formation of the floating gates of the memory cells and access select transistors. FIG. 7 shows a plan view that illustrates the initial formation of the floating gates. FIGS. 8A-8C show cross-sectional diagrams taken along lines 7A—7A, 7B—7B, and 7C—7C, respectively.

As shown in FIGS. 8A-8C, the floating gates are first formed by growing a layer of gate oxide 120 approximately 150-200 Å thick over substrate 100. Next, a layer of polysilicon (poly1) 122 approximately 1,500 Å thick is deposited over the layer of gate oxide 120 and the field oxide regions FOXC and FOXT. The layer of poly1 122 is then doped in a conventional manner. As is well known, the floating gates of the array are formed from the layer of poly1 122.

Next, as further shown in FIGS. 8A-8C, a composite dielectric layer of oxide/nitride/oxide (ONO) 124 is formed on the layer of poly1 122. Following this, a photoresist mask 126 is formed over the layer of ONO 124 and patterned to expose the segment select region and to define a plurality of spaced-apart parallel strips on the layer of ONO 124.

Figure 9:
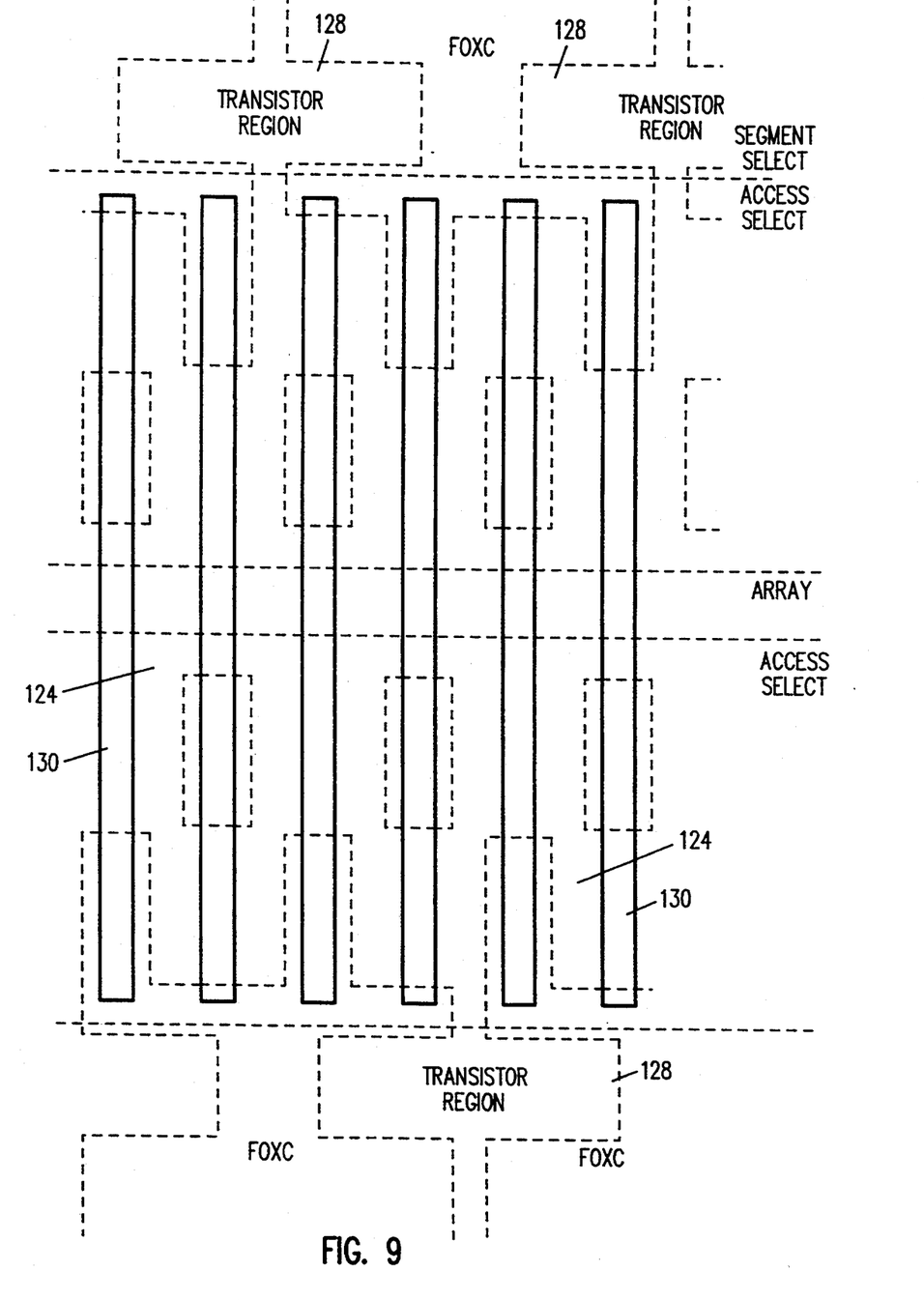
FIG. 9 is a plan view illustrating a plurality of strips 130 formed over the layer of ONO 124.

FIG. 9 shows a plan view that illustrates a plurality of strips 130 formed over the layer of ONO 124. As shown in FIG. 9, in accordance with the present invention, the ends of four adjacent strips are formed over one field oxide region FOXC in one row of field oxide regions FOXC. Further, the opposite ends of a first two of the four adjacent strips are formed over a field oxide region FOXC in an adjacent row, while the opposite ends of a second two of the four adjacent strips are formed over an adjacent field oxide region FOXC in the adjacent row.

Referring back to FIG. 8, after photoresist mask 126 has been formed, the unmasked layer of ONO 124 and underlying layer of poly1 122 are then plasma etched to form a plurality of spaced-apart, parallel strips 132 of ONO/poly1. Following the formation of the strips 122 of ONO/poly1, photoresist mask 116 is stripped. As a result, as shown in FIG. 7, the ends of four strips 132 of ONO/poly1 are formed on one field oxide region FOXC, while the opposite ends are formed on two adjacent field oxide regions FOXC in an adjacent row. Further, the layer of ONO 124 and the underlying layer of poly1 122 are removed from the segment select region.

Figure 10A:
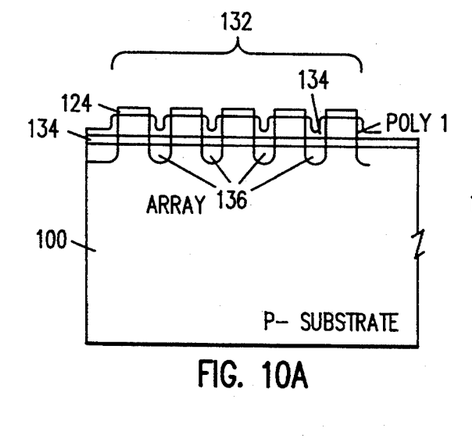
FIGS. 10A-10D are cross-sectional diagrams taken along lines 7A—7A, 7B—7B, 7C—7C, and 7C—7C, respectively.
Figure 10B:
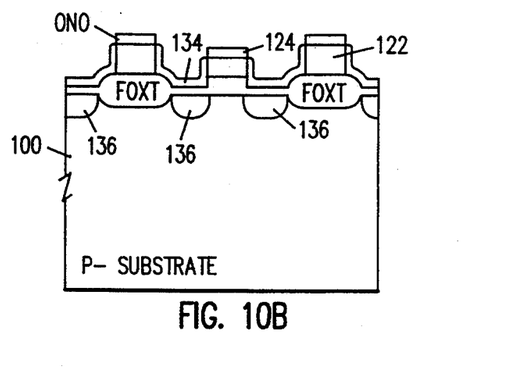
Figure 10C:
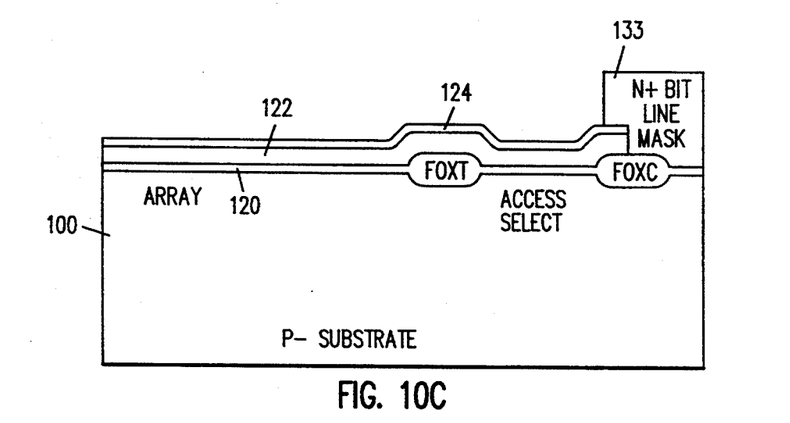

After photoresist mask 126 has been removed, the next step is the formation of the bit lines of the array. FIGS. 10A-10D show cross-sectional diagrams taken along lines 7A—7A, 7B—7B, 7C—7C, and 7C—7C, respectively. As shown in FIGS. 10A-10C, once mask 126 has been stripped, a layer of thin edge oxide 134 is grown along the sides of the ONO/poly1 strips 132 and over substrate 100. Next, a bit line mask 133 is formed to protect the segment select regions and the periphery. Following this, arsenic is implanted into substrate 100 through the layer of oxide 134 to define the N+ bit lines 136. Next, the bit line mask 133 is stripped.

Following this, a layer of differential oxide 138 (see FIG. 12) is grown over the N+ bit lines 136. The layer of differential oxide 138 must be at least as thick as the layer of ONO 124 to avoid trenching of the substrate during a subsequent self aligned etch step which forms each of the cells and access transistors of the array.

At this point, the segment select transistor are initially formed in the segment select regions while a plurality of MOS transistors can be initially formed in the periphery. The typical AMG EPROM includes a number of MOS transistors that function, for example, as current sense detectors, amplifiers, and address decoders.

Figure 10D:
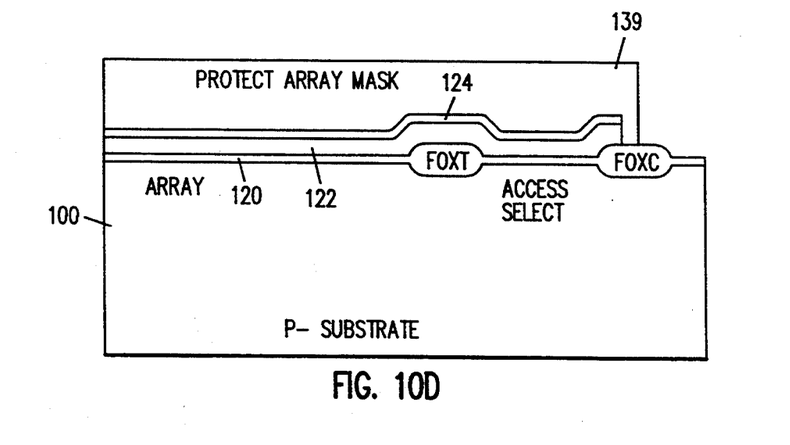

As shown in FIG. 10D, the segment select transistors and the peripheral MOS devices are first formed by forming a protect array mask 139 over the array and access select regions of substrate 100. Following the formation of the protect array mask 139, the remaining layer of oxide is etched from the segment select regions and the periphery. Once the remaining layer of oxide has been removed, the protect array mask 139 is stripped.

Next, a second layer of gate oxide 150 (see FIGS. 13 and 14A) approximately 200 Å thick is grown on the P-type semiconductor substrate in the segment select region and the periphery. After the layer of second gate oxide 150 has been grown, the next step is to set the channel threshold voltages for each of the to be formed segment select and MOS transistors.

The threshold voltages are set by forming and patterning a threshold mask, and then implanting a P-type dopant through the unmasked layer of gate oxide. Following this, the threshold voltage mask is stripped.

Figure 11:
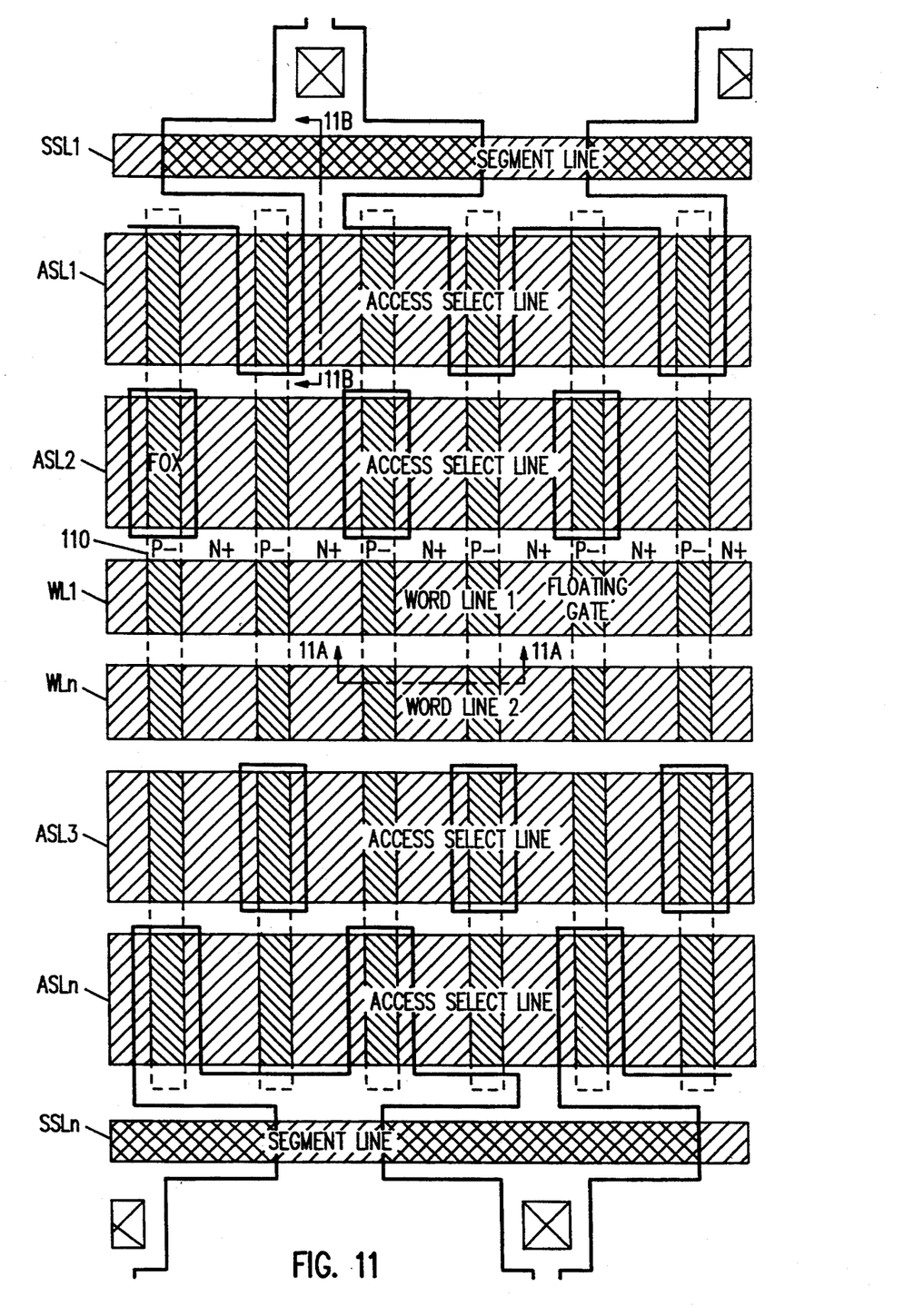
FIG. 11 is a plan view illustrating the formation of the word lines WL1-WLn, the access select lines ASL-1-ASLn, and the segment lines SSL1-SSLn.
Figure 12:
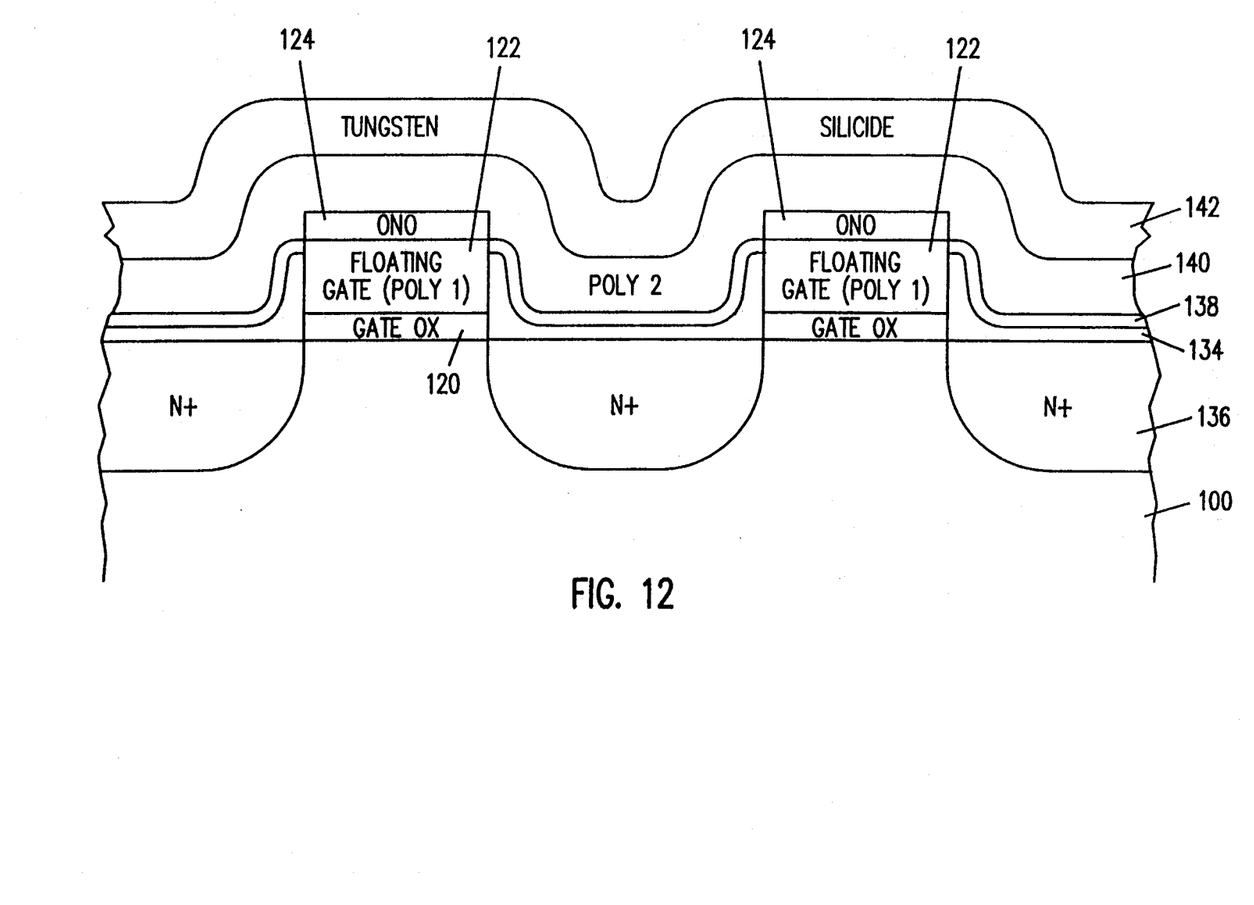
FIG. 12 is a dross-sectional view taken along lines 11A—11A.
Figure 13:
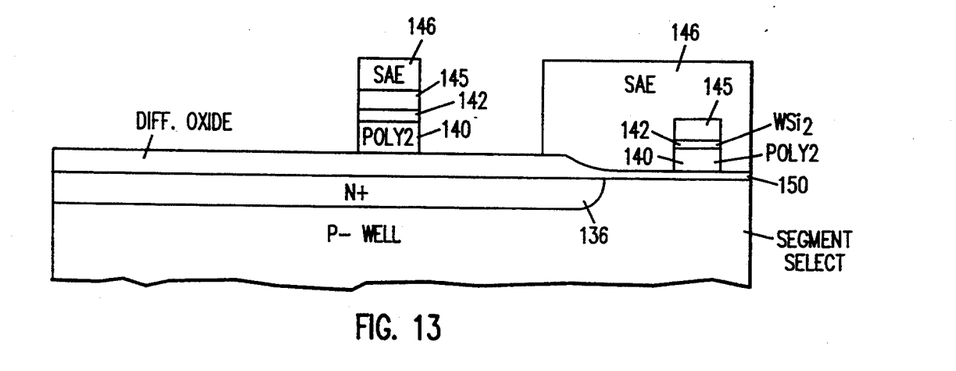
FIGS. 13, 14A, and 14B are cross-sectional diagrams taken along lines 11B—11B.
Figure 14A:
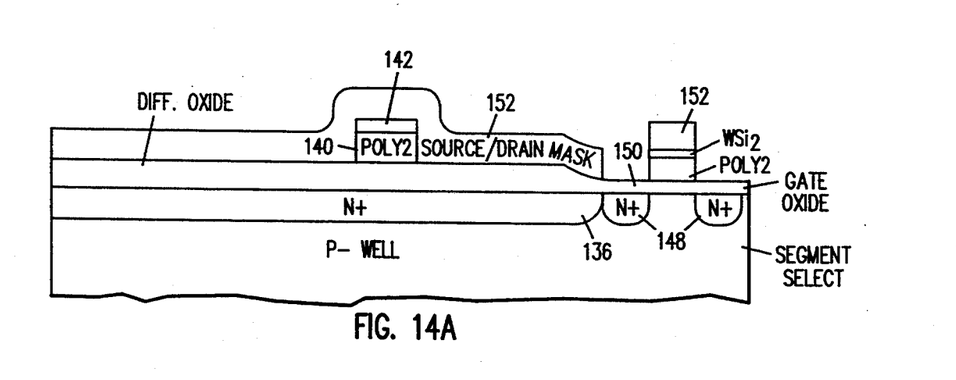
Figure 14B:
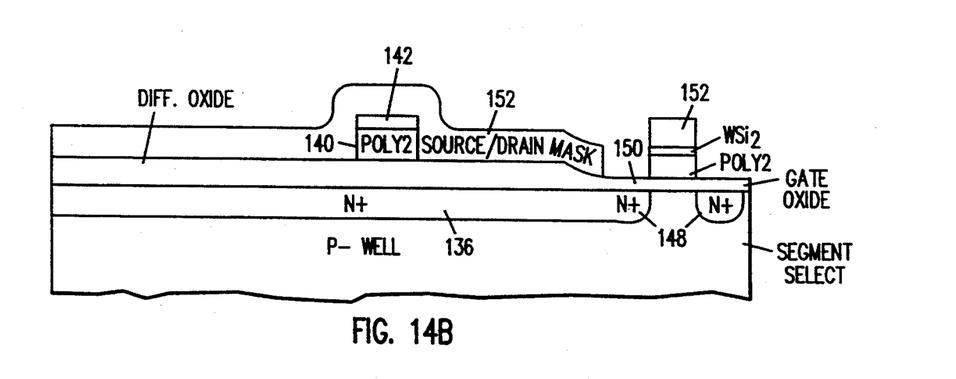

Once the plurality of segment select and MOS transistors have been initially formed, the next step is to form the word lines, access transistor lines, segment lines, and the gate electrodes of the MOS transistors. FIG. 11 shows a plan view that illustrates the formation of the word lines WL1-WLn, the access select lines ASL1-ASLn, and the segment lines SSL1-SSLn. FIG. 12 shows a cross-sectional view taken along lines 11A—11A. FIGS. 13, 14A, and 14B show cross-sectional diagrams taken along lines 11B—11B.

Referring to FIG. 12, after the threshold voltages of the segment select and MOS devices have been set, a layer of second polysilicon (poly2) 140 approximately 1,500 Å is deposited over the surface of the entire device and doped in a conventional manner. In the preferred embodiment, this is followed by the deposition of an overlying layer of tungsten silicide 142 approximately 2,000 Å thick. As is well known, the control gates of the cells are formed by the portion of the composite layer of tungsten silicide/poly2 that is formed over the floating gates.

As shown in FIG. 13, a word line mask 145 is then formed over the tungsten silicide/poly2 composite and patterned to define the word lines WL1-WLn, the access select lines ASL1-ASLn, the segment lines SSL1-SSLn, and the gate electrodes of the peripheral MOS devices. Following this, the tungsten silicide/poly2 composite is etched until the unmasked layers of tungsten silicide, and poly2 have been removed. It is noted that the access transistors are EPROM cells which have a larger width than the array flash EPROM cells. This allows the access transistors to drive larger currents than the array cells.

After the tungsten silicide/poly2 composite has been etched, the word line mask is UV-hardened and a self-aligned etch (SAE) mask 146 is formed so that the overlying tungsten silicide/poly2 composite can be used as a mask for a selfaligned etch of the ONO/poly1 composite. The SAE mask 146 is formed to also protect the segment select regions. This then is followed by a stacked etch the ONO/poly1 composite to define each of the memory cells and access transistors.

Referring to FIG. 14A, after the self-aligned etch of the ONO/poly1 composite, the SAE mask 146 is removed. Next, a source/drain mask 152 is formed and patterned to define the N+ source and drain regions 148 of the segment select transistors, and the source and drain regions of the peripheral MOS devices. Once the source/drain mask 152 has been formed, the P-type semiconductor substrate 100 underlying the unmasked areas is implanted with arsenic through the layer of gate oxide 150 to a depth of 0.2 to 0.3 microns. As shown in FIG. 14A, the implant is self-aligned to the edges of the layer of poly2 140. The source/drain mask 152 is then stripped. Next, as shown in FIG. 14B, an oxidation step is performed to diffuse the N+ regions 148 to connect each bit line 136 with one N+ region 148 in each segment select region. Following this, the process follows conventional steps. For additional background information, U.S. Pat. No. 5,246,874 filed by Albert Bergemont for METHOD OF MAKING FAST ACCESS AMG EPROM is hereby incorporated by reference.

Thus, in accordance with the present invention and as shown in FIG. 11, by eliminating the even numbered segment select transistors in every other row of segment select transistors, and by eliminating the odd numbered segment select transistors in the remaining rows of segment select transistors, the width of the remaining segment select transistors can be substantially increased. As a result, the maximum current that can be driven by the segment select transistors can be substantially increased.

Figure 15:
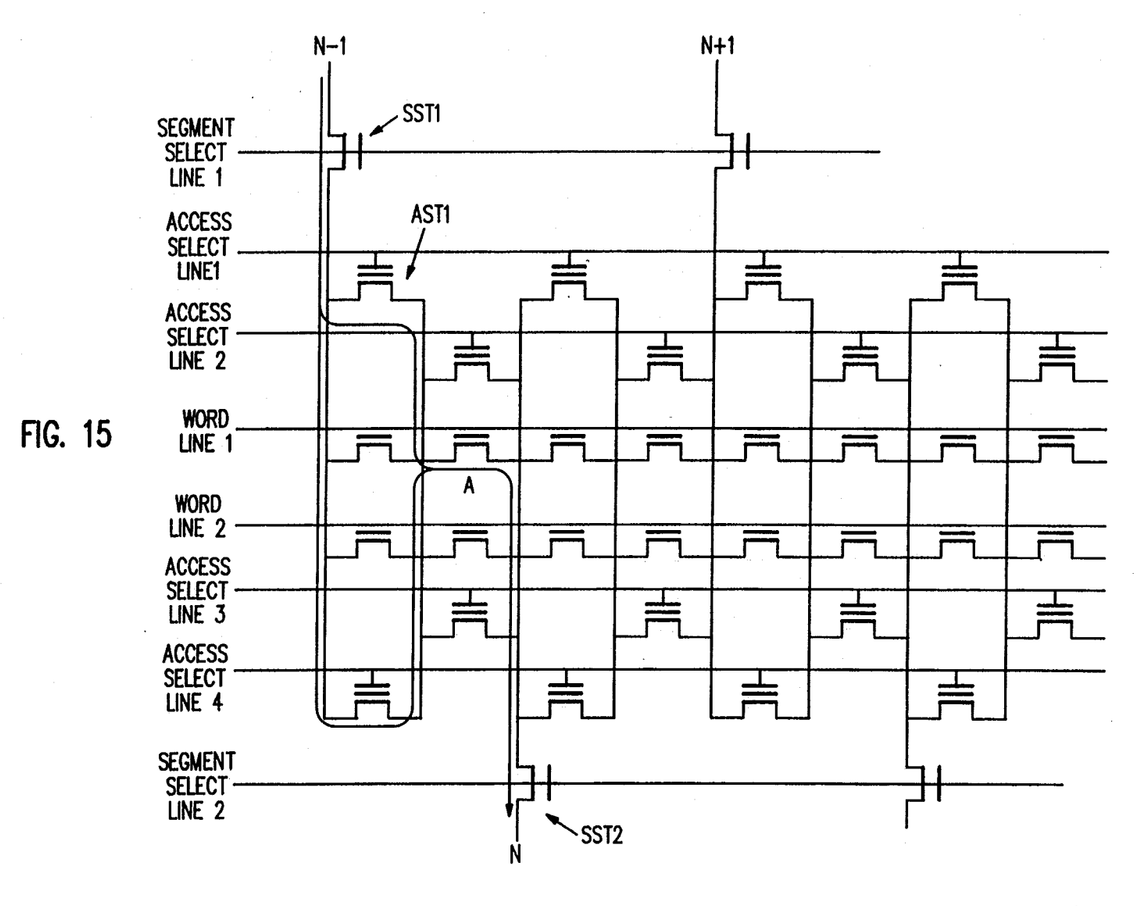
FIGS. 15 and 16 are schematic diagrams that illustrate the operation of the fast-access EPROM of the present invention.
Figure 16:
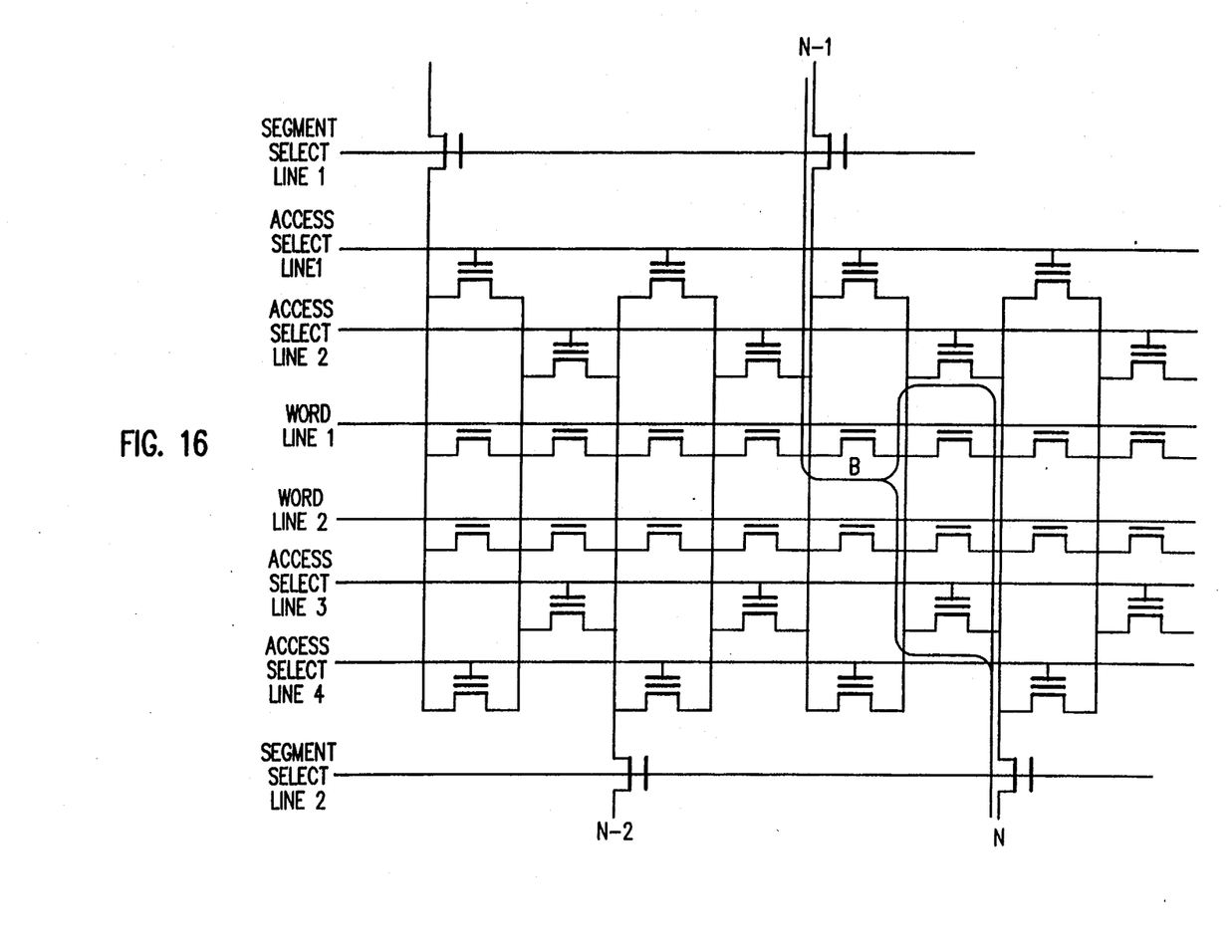

FIGS. 15 and 16 show schematic diagrams that illustrate the operation of the fast-access EPROM of the present invention. As shown in FIG. 15, to program cell A, segment line 1, segment line 2, and word line 1 are set to a programming voltage (12 volts). At the same time, access select lines 1 and 4 are set to a supply voltage (5-7 volts), while access select lines 2 and 3 and word line 2 are held at ground.

Further, bit line N−1 is held at ground, bit line N is taken to the supply voltage (5-7 V), and bit line N+1 is allowed to float. As a result of these bias conditions, as shown in FIG. 15, a current path is established from segment select transistor SST1, through access select transistor AST1, through cell A, and to segment select transistor SST2. The bias conditions of cell A cause hot electron injection from the drain side to the floating gate of cell A.

Similarly, to program cell B, as shown in FIG. 16, segment line 1, segment line 2, and word line 1 are set to the programming voltage. Access select lines 2 and 3 and word line 2 are set to the supply voltage (5-7 volts), while access select lines 1 and 4 and word line 2 are held at ground. Further, bit line N−1 is set to the supply voltage, bit line N is held at ground, and bit line N−2 is allowed to float.

To read cell A, segment lines 1 and 2, access select lines 1 and 4, and word line 1 are set to the supply voltage, while access select lines 2 and 3 and word line 2 are held at ground. At the same time, bit lines N−1, N, and N+1 are precharged to a read voltage (1.5-2 V). Once the bias conditions are set, bit line N is pulled down to ground, bringing the intermediate source to ground.

Similarly, to read cell B, segment lines 1 and 2, access select lines 2 and 3, and word line 1 are set to the supply voltage, while access select lines 1 and 4 and word line 2 are held at ground. At the same time, bit lines N−1, N, and N−2 are precharged to a read voltage (1.5-2 V). Once the bias conditions are set, bit line N−1 is pulled down to ground, bringing the intermediate source to ground.

During reading, only one segment of the array is precharged. This lowers the bit line capacitance to the capacitance of only one segment plus an aluminum bit line, further increasing read access speed. For example, if a bit line has a total of 1024 cells and each segment has 64 cells, then read isolation of a segment using the segment lines reduces bit line capacitance by a factor of 16.

Although the present invention has been described with respect to a conventional fast-access AMG EPROM, one skilled in the art should recognize that the concepts of the present invention are equally applicable to AMG "flash" EPROMs which utilize similar fabrication processes.

For example, in U.S. application Ser. No. 07/988,293, filed by Albert Bergemont on Dec. 8, 1992, titled HIGH DENSITY CONTACTLESS FLASH EPROM ARRAY USING CHANNEL ERASE, a flash EPROM is described wherein the substrate is formed in a semiconductor material of N-type conductivity so that the substrate functions as a P-well. The process for forming a well of P-type conductivity in an N-type semiconductor material is well known in the art.

Further, in the '293 application, every other bit line BL of the series of bit lines BL1-BLn is formed as a graded N+/N− bit line by masking alternate bit lines, followed by a phosphorous implant.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A segment of an electrically programmable read-only-memory (EPROM) formed in a semiconductor substrate, the segment comprising:
   a plurality of spaced-apart, parallel, bit lines formed in the semiconductor substrate so that each bit line extends from a first side of the segment to a second side of the segment;
   a plurality of spaced-apart memory cells formed in a plurality of rows so that one memory cell in each row of memory cells is formed on the substrate between each pair of adjacent bit lines;
   a plurality of word lines formed so that each word line contacts each memory cell in a row of memory cells;
   a plurality of spaced-apart access select transistors formed in a plurality of pairs of rows so that, in each row of access select transistors, one access select transistor is formed on the substrate between every other pair of bit lines, and so that, in each pair of rows of access select transistors, one access select transistor is formed between each pair of bit lines; and
   a plurality of access select lines formed so that each access select line contacts each of the access select transistors in a row of access select transistors; and
   a plurality of segment select transistors formed so that only every fourth bit line of the bit lines at the first side of the segment is connected to a segment select transistors, and so that only every fourth bit line of the bit lines at the second side of the segment is connected to a segment select transistor, the segment select transistors connected to the bit lines at the first side being staggered with respect to the segment select transistors connected to the bit lines at the second side so that every other bit line is contacted by one segment select transistor.

2. The segment of claim 1 and further comprising a plurality of segment limes formed so that a first segment line contacts each of the segment select transistors connected to the bit lines at the first side, and a second segment line contacts each of the segment select transistors connected to the bit lines at the second side.

3. The segment of claim 1 wherein every other bit line of the plurality of bit lines comprises a graded N+/N− bit line.

4. A method for programming a selected cell in a segment of an electrically programmable read-only memory formed in a semiconductor substrate, the method comprising the steps of:
   providing the electrically programmable read-only-memory (EPROM), the EPROM comprising:
      a plurality of spaced-apart, parallel, bit lines formed in the semiconductor substrate so that each bit line extends from a first side of the segment to a second side of the segment,
      a plurality of spaced-apart memory cells formed in a plurality of rows so that one memory cell in each row of memory cells is formed on the substrate between each pair of adjacent bit lines,
      a plurality of word lines formed so that each word line contacts each memory cell in a row of memory cells, one word line corresponding to the selected cell,
      a plurality of spaced-apart access select transistors formed in a plurality of pairs of rows so that, in each row of access select transistors, one access select transistor is formed on the substrate between every other pair of bit lines, and so that, in each pair of rows of access select transistors, one access transistor is formed between each pair of bit lines,
      a plurality of access select lines formed so that each access select line contacts each of the access select transistors in a row of access select transistors, two pair of access select lines of the plurality of access select lines corresponding to the selected cell, said two pair of access select lines including a first pair of access select lines and a second pair of access select lines;
      a plurality of segment select transistors formed so that only every fourth bit line of the bit lines at the first side of the segment is connected to a segment select transistor, and so that only every fourth bit line of the bit lines at the second side of the segment is connected to a segment select transistor, the segment select transistors connected to the bit lines at the first side being staggered with respect to the segment select transistors connected to the bit lines at the second side so that every other bit line is contacted by one segment select transistor, a plurality of segment lines formed so that a first segment line contacts each of the segment select transistors connected to the bit lines at the first side, a second segment line contacts each of the segment select transistors at the second side, one segment select transistor in the first segment line corresponds to the selected cell, and one segment select transistor in the second segment line corresponds to the selected cell, setting the first and second segment lines to a programming voltage;

setting one access select line of the first pair of access select lines, and one access select line of the second pair of access select lines to a supply voltage;

setting a remaining access select line of the first pair of access select lines, and a remaining access select line of the second pair of access select lines to ground;

setting said one word line to the programming voltage;

setting the bit line than contacts said one segment select transistor in the first segment line to a first voltage; and setting the bit line that contacts said one segment select transistor in the second segment line to a second voltage.

* * * * *